(12) United States Patent
Christensen et al.

(10) Patent No.: US 12,267,085 B2
(45) Date of Patent: Apr. 1, 2025

(54) HIGH FREQUENCY DIGITIZER AND METHOD

(71) Applicant: MagiQ Technologies, Inc., Somerville, MA (US)

(72) Inventors: Caleb Christensen, Medord, MA (US); A. Craig Beal, Stoneham, MA (US); Mark Lucas, Chelmsford, MA (US); Michael LaGasse, Newton, MA (US); Audrius Berzanskis, Boston, MA (US)

(73) Assignee: MagiQ Technologies, Inc., Somverville, MA (US)

( * ) Notice: Subject to any disclaimer, the term of this patent is extended or adjusted under 35 U.S.C. 154(b) by 218 days.

(21) Appl. No.: 18/195,332

(22) Filed: May 9, 2023

(65) Prior Publication Data

US 2023/0370081 A1  Nov. 16, 2023

Related U.S. Application Data

(60) Provisional application No. 63/340,405, filed on May 10, 2022.

(51) Int. Cl.
*H03M 1/12* (2006.01)
*H03M 1/00* (2006.01)
*H03M 1/06* (2006.01)
*H03M 1/10* (2006.01)

(52) U.S. Cl.
CPC ............... *H03M 1/12* (2013.01); *H03M 1/00* (2013.01); *H03M 1/06* (2013.01); *H03M 1/10* (2013.01)

(58) Field of Classification Search
CPC ............ H03M 1/12; H03M 1/00; H03M 1/10; H03M 1/06
See application file for complete search history.

(56) References Cited

U.S. PATENT DOCUMENTS

2019/0324298 A1* 10/2019 Dayel ................ G02F 1/0147

* cited by examiner

*Primary Examiner* — Joseph J Lauture
(74) *Attorney, Agent, or Firm* — Danielson Legal LLC (57) ABSTRACT

Methods and devices for processing a signal. The methods include supplying to a first modulator a first RF signal and a first optical signal, wherein the first modulator is configured to output a first output signal; generating a first intensity signal that is based on the first output signal, wherein the first intensity signal is further based on a first biasing parameter; and providing a first intensity signal to a first analog-to-digital converter (ADC) to create a first digital signal processable by a signal processing unit.

19 Claims, 8 Drawing Sheets

HIGH FREQUENCY DIGITIZER AND METHOD

CROSS REFERENCE TO RELATED APPLICATIONS

The present application claims the benefit of and priority to U.S. provisional application No. 63/340,405, filed on May 10, 2022, the content of which is hereby incorporated by reference as if set forth in its entirety herein.

TECHNICAL FIELD

Embodiments described herein generally relate to systems and methods for processing signals and, more particularly but not exclusively, to systems and methods for processing high frequency signals.

BACKGROUND

Digitization is the process of converting data into a digital format. Systems receive radio frequency (RF) signals from a variety of sources and for a variety of purposes. Oftentimes, however, these signals are accompanied by undesirable noise.

Although some existing systems can process high frequency signals, they generally require a complex configuration of components. For example, these existing systems require filters, limiters, cancellers, automatic gain control (AGC) circuitry, or the like. This can make existing systems costly and complex.

A need exists, therefore, for systems and methods that overcome the disadvantages associated with existing techniques for processing signals.

SUMMARY

This summary is provided to introduce a selection of concepts in a simplified form that are further described below in the Detailed Description section. This summary is not intended to identify or exclude key features or essential features of the claimed subject matter, nor is it intended to be used as an aid in determining the scope of the claimed subject matter.

According to one aspect, embodiments relate to a method for processing a signal. The method includes supplying to a first modulator a first RF signal and a first optical signal, wherein the first modulator is configured to output a first output signal; generating a first intensity signal that is based on the first output signal, wherein the first intensity signal is further based on a first biasing parameter; and providing a first intensity signal to a first analog-to-digital converter (ADC) to create a first digital signal processable by a signal processing unit.

In some embodiments, providing the first intensity signal to the first ADC includes providing the first intensity signal to a photodetector to produce an analog signal representative of an intensity of the first intensity signal, wherein the produced analog signal is communicated to the first ADC.

In some embodiments, the method further includes splitting an RF signal into the first RF signal and a second RF signal; supplying to a second modulator the second RF signal and a second optical signal, wherein the second modulator is configured to output a second output signal; generating a second intensity signal that is based on the second output signal, wherein the second intensity signal is further based on a second biasing parameter; and providing the second intensity signal to a second analog-to-digital converter (ADC) to create a second digital signal processable by the signal processing unit.

In some embodiments, the first intensity signal and the second intensity signal are at least approximately in phase quadrature.

In some embodiments, the method further includes providing the first output signal from the first modulator to an optical hybrid, wherein the optical hybrid is configured to provide the first biasing parameter to the first output signal to generate the first intensity signal. In some embodiments, the first biasing parameter is partly or fully fixed during fabrication of the optical hybrid.

In some embodiments, the first intensity signal and the second intensity signal are each transmitted as an optical signal.

In some embodiments, the method further includes filtering, using the signal processing unit, the first intensity signal and the second intensity signal to increase the signal-to-noise ratio and effective number of bits.

In some embodiments, the method further includes executing a phase unwrapping procedure to reconstruct the phase of the received RF signal.

According to another aspect, embodiments relate to a signal processing apparatus. The apparatus includes a first modulator configured to receive a first RF signal, a first optical signal, and further configured to output a first output signal that is further used to generate a first intensity signal, wherein the first intensity signal is further based on a first biasing parameter; and at least one analog-to-digital converter (ADC) to create from the first intensity signal a first digital signal processable by a signal processing unit.

In some embodiments, the apparatus further includes a first photodetector configured to measure the first intensity signal and produce an analog signal representative of an intensity of the first intensity signal and communicate the analog signal to the signal processing unit.

In some embodiments, the apparatus further includes an RF splitter to split an RF signal into the first RF signal and the second RF signal; and a second modulator configured to receive a second RF signal and a second optical signal, and further configured to output a second output signal that is further used to generate a second intensity signal, wherein the second intensity signal is further based on a second biasing parameter.

In some embodiments, the first intensity signal and the second intensity signal are at least approximately in phase quadrature.

In some embodiments, the apparatus further includes an optical hybrid configured to provide the first biasing parameter to the first output signal to generate the first intensity signal. In some embodiments, the first biasing parameter is partly or fully fixed during fabrication of the optical hybrid.

In some embodiments, the signal processing unit is further configured to filter the first intensity signal to increase the signal-to-noise ratio and effective number of bits. In some embodiments, the signal processing unit is further configured to execute a phase unwrapping procedure to reconstruct the phase of the RF signal.

In some embodiments, the first modulator is further configured to receive the first biasing parameter.

According to yet another aspect, embodiments relate to a method for processing a signal. The method includes supplying to a first modulator a first RF signal and a first optical signal, wherein the first modulator is configured to output a first output signal; generating a first intensity signal that is based on the first output signal, wherein the first intensity signal is further based on a first biasing parameter; providing the first intensity signal to a photodetector to produce an analog signal representative of an intensity of the first intensity signal; providing the analog signal to a first analog-to-digital converter (ADC) to create a first digital signal processable by a signal processing unit; and executing a phase unwrapping procedure to reconstruct the phase of the first RF signal.

BRIEF DESCRIPTION OF DRAWINGS

Non-limiting and non-exhaustive embodiments of the invention are described with reference to the following figures, wherein like reference numerals refer to like parts throughout the various views unless otherwise specified.

DETAILED DESCRIPTION

Various embodiments are described more fully below with reference to the accompanying drawings, which form a part hereof, and which show specific exemplary embodiments. However, the concepts of the present disclosure may be implemented in many different forms and should not be construed as limited to the embodiments set forth herein; rather, these embodiments are provided as part of a thorough and complete disclosure, to fully convey the scope of the concepts, techniques and implementations of the present disclosure to those skilled in the art. Embodiments may be practiced as methods, systems or devices. Accordingly, embodiments may take the form of a hardware implementation, an entirely software implementation or an implementation combining software and hardware aspects. The following detailed description is, therefore, not to be taken in a limiting sense.

Reference in the specification to "one embodiment" or to "an embodiment" means that a particular feature, structure, or characteristic described in connection with the embodiments is included in at least one example implementation or technique in accordance with the present disclosure. The appearances of the phrase "in one embodiment" in various places in the specification are not necessarily all referring to the same embodiment. The appearances of the phrase "in some embodiments" in various places in the specification are not necessarily all referring to the same embodiments.

Some portions of the description that follow are presented in terms of symbolic representations of operations on non-transient signals stored within a computer memory. These descriptions and representations are used by those skilled in the data processing arts to most effectively convey the substance of their work to others skilled in the art. Such operations typically require physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices. Portions of the present disclosure include processes and instructions that may be embodied in software, firmware or hardware, and when embodied in software, may be downloaded to reside on and be operated from different platforms used by a variety of operating systems.

The present disclosure also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each may be coupled to a computer system bus. Furthermore, the computers referred to in the specification may include a single processor or may be architectures employing multiple processor designs for increased computing capability.

The processes and displays presented herein are not inherently related to any particular computer or other apparatus. Various general-purpose systems may also be used with programs in accordance with the teachings herein, or it may prove convenient to construct more specialized apparatus to perform one or more method steps. The structure for a variety of these systems is discussed in the description below. In addition, any particular programming language that is sufficient for achieving the techniques and implementations of the present disclosure may be used. A variety of programming languages may be used to implement the present disclosure as discussed herein.

In addition, the language used in the specification has been principally selected for readability and instructional purposes and may not have been selected to delineate or circumscribe the disclosed subject matter. Accordingly, the present disclosure is intended to be illustrative, and not limiting, of the scope of the concepts discussed herein.

RF signals are often accompanied by undesirable noise. The Radiocommunication Sector of the International Telecommunication Union defines radio noise as a "time-varying electromagnetic phenomenon having components in the radio-frequency range, apparently not conveying information and which may be superimposed on, or combined with, a wanted signal."

The noise source, the type of noise, or severity thereof may depend on the application or type of signal. For example, radio signals with a frequency in the range of 0.1 Hz to 100 GHz may suffer from noise due to lightning; atmospheric gasses; the sun; the Earth's surface; man-made sources such as power transmission lines, hydrometers, electrical machinery, internal combustion engine ignitions; and temperature.

A noise feature $F_a$ may represent the degree to which radio noise affects a receiving system. $F_a$ may depend on factors such as an available noise power from an equivalent lossless antenna, Boltzmann's constant k ($1.38 \times 10^{-23}$ J/K), temperature, and noise power bandwidth of the receiving system.

Figure 1:
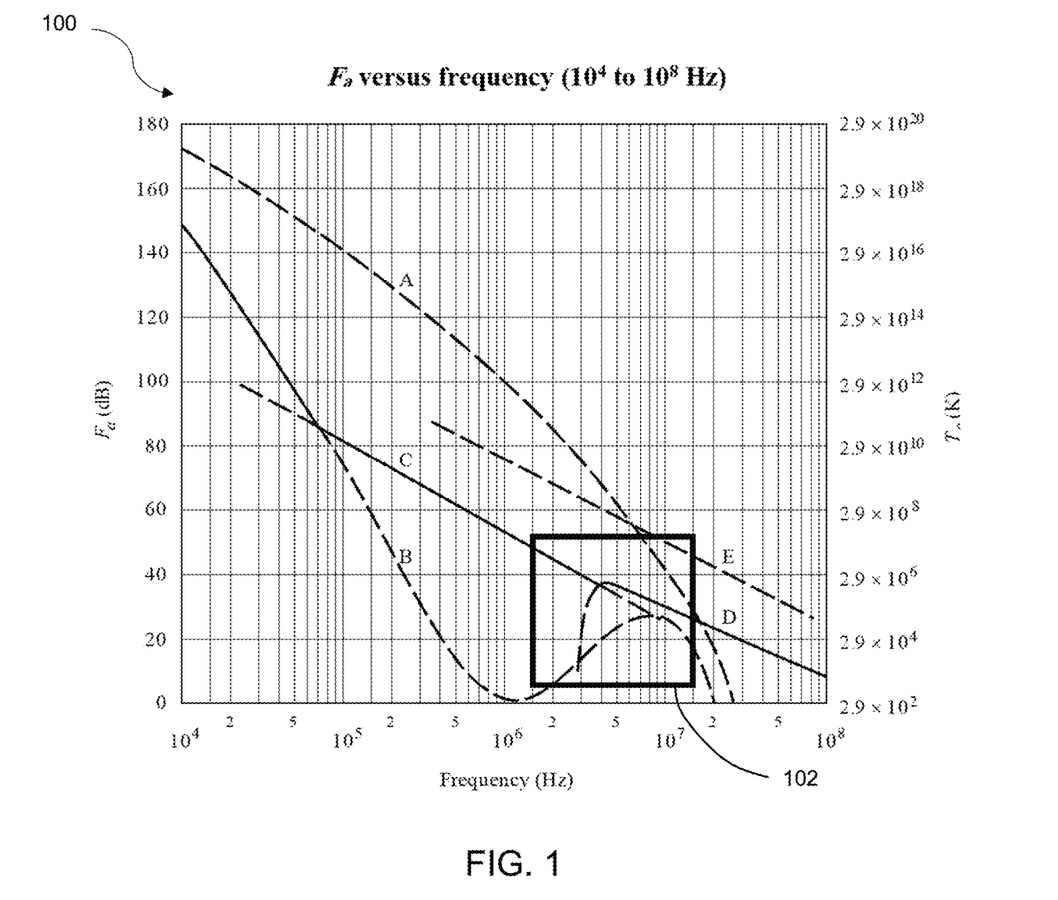
FIG. 1 presents a graphical representation of various categories of noise for signals in the frequency range of 10 kHz to 100 MHz.

FIG. 1 presents a graphical representation 100 showing the frequency range of 10 kHz to 100 MHz for various categories of noise $F_A$ (dB). Line A represents the plot for atmospheric noise that is exceeded 0.5% of the time, line B represents the plot for atmospheric noise that is exceeded 99.5% of the time, line C represents noise expected from man-made sources, line D represents the plot for galactic noise, and line E represents the plot for median city area, man-made noise. The solid line indicates the minimum noise level expected across a range of frequencies.

The highlighted box 102 denotes the minimum noise level expected in the high frequency (HF) range of 1 MHz to 10 MHz. As can be seen, in this range of frequency there is an expected noise $F_A$ of approximately 20 dB to 52 dB. The noise in this range or at least a portion thereof may be referred to as "sky noise."

The embodiments described herein provide novel systems and methods for digitizing HF signals. The noise figure of the embodiments described herein are not degraded by high frequency input powers of up to +40 dBm, and do not require analog mitigation strategies such as filters, AGCs, limiters, or cancellers.

Figure 2:
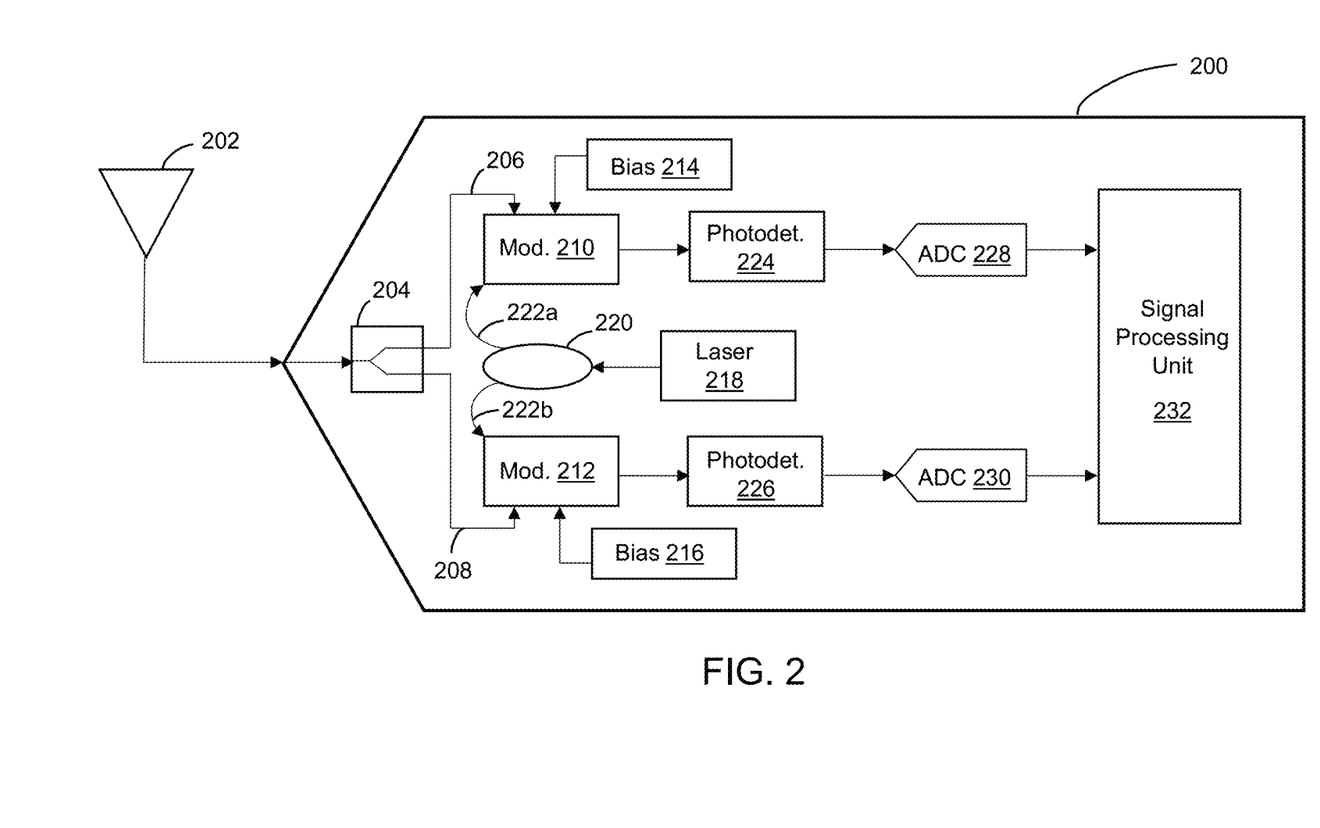
FIG. 2 illustrates a digitizer in accordance with one embodiment.

FIG. 2 illustrates an apparatus (e.g., a digitizer) 200 for processing a signal in accordance with one embodiment. In operation, an antenna 202 may receive an RF signal from a source (not shown in FIG. 2). As discussed above, the signal may be accompanied by radio noise from any number of sources or causes.

The digitizer 200 may include a signal splitter 204 for splitting the RF signal into a first RF signal 206 and a second RF signal 208. The signal splitter 204 may be a resistive power splitter, a hybrid power splitter, or the like.

The first RF signal 206 may be communicated to a first modulator 210. The first modulator 210 may be a Mach-Zehnder modulator, for example. The second RF signal 208 may be transmitted to a second modulator 212, which may also be a Mach-Zehnder modulator. The first modulator 210 may also receive an i-bias signal 214, and the second modulator 212 may receive a q-bias signal 216.

The digitizer 200 may also include one or more laser sources 218 emitting an optical signal to be split by an optical splitter 220. The optical splitter 220 enables incident light from the laser source 218 to be split into multiple light beams 222a and 222b. Light beam 222a may be transmitted to the first modulator 210, and light beam 222b may be transmitted to the second modulator 212.

Accordingly, the first modulator 210 receives as input the first RF signal 206, an i-bias signal 214, and light beam 222a. The second modulator 212 receives as input the second RF signal 208, the q-bias signal 216, and light beam 222b.

Figure 3:
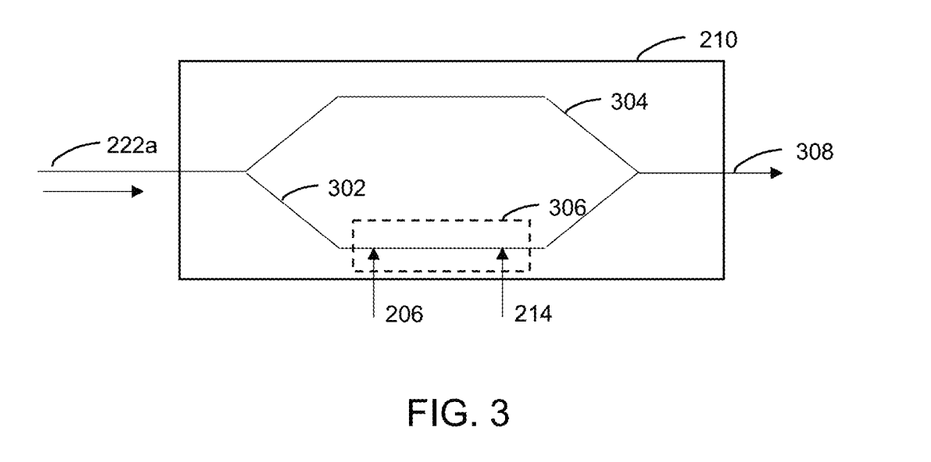
FIG. 3 illustrates the first modulator of FIG. 2 in accordance with one embodiment.

FIG. 3 illustrates the first modulator 210 of FIG. 2 in accordance with one embodiment. The light beam 222a may have an amplitude A and enter the modulator 210 where it is split into a lower path 302 and an upper path 304. At this point the signals in each path 302 and 304 may have an amplitude A/2. In region 306 of the lower path 302, the first RF signal 206 and the i-bias signal 214 may modify the signal therein. For example, the application of the first RF signal 206 may slow the rate at which light is propagated through the lower path 302. This causes the signal in the lower path 302 to be out of phase with the signal in the upper path 304 to create a time-varying, modified output signal 308.

Modulator 212 may operate similarly to modulator 210. That is, the second RF signal 208 and the q-bias signal 216 may modify a portion of the light beam 222b to produce a modified output signal.

The voltage of the RF signal received by the antenna 202 can be thought of the phase parameter in a polar coordinate system such that:

$$V_{RF}(t) = V_0 \sin(\omega_{RF} t) \text{ and} \quad \text{(Eq. 1)}$$

$$\phi(t) = \frac{\pi V_{RF}(t)}{2V_\pi} = \frac{\pi V_0}{2V_\pi} \sin(\omega_{RF} t) \quad \text{(Eq. 2)}$$

Where $V_\pi$ is a device-dependent parameter related to modulation efficiency which determines how efficiently RF voltage is converted to optical phase. $V_\pi$ has units of volts/π radians of optical phase shift. The modulators 210 and 212 transform optical phase φ into intensity according to a $\sin^2(\varphi)$ relationship.

Figure 4:
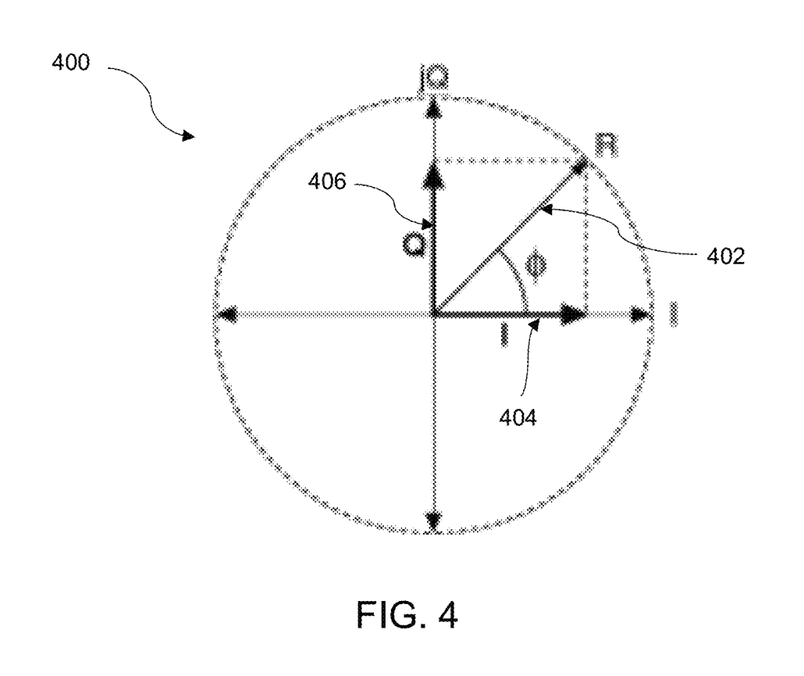
FIG. 4 illustrates a polar-to-cartesian coordinates plot in accordance with one embodiment.

FIG. 4 illustrates a polar-to-cartesian coordinates plot 400 in accordance with one embodiment. Modulator 210 transforms the first RF signal 206 (represented as arrow 402) to a coordinate along the I axis 404 and modulator 212 transforms the second RF signal 208 to a coordinate along the Q axis 406. The projection of a rotating phasor onto the I & Q axes limits the amplitude of the signal later applied to the High Speed ADCs 224 and 226 because sinusoids range between ±1.

The output of the modulator 210 may be a signal representative of the intensity $I_I(t)$ of the modulated first RF signal 206 and given by:

$$I_I(t) = \sin^2[\phi(t)] = \frac{1 - \cos(2\phi(t))}{2} \xrightarrow{\text{AC Coupling}} I_I(t) = \cos\left(\frac{\pi V_{RF}(t)}{V_\pi}\right) \quad \text{(Eq. 3)}$$

The output of the modulator 212 may be a signal representative of the intensity $I_Q(t)$ of the modulated first RF signal and given by $$I_Q(t) = \sin^2\left[\phi(t) - \frac{\pi}{4}\right] = \frac{1 - \cos\left(2\phi(t) - \frac{\pi}{2}\right)}{2} = \quad \text{(Eq. 4)}$$

-continued $$\xrightarrow[2]{1-\sin(2\phi(t))} \xrightarrow{\text{AC Coupling}} I_Q(t) = \sin\left(\frac{\pi V_{RF}(t)}{V_\pi}\right)$$

As can be seen in the above equations, large values of $V_0$ and small values of $V_\pi$ lead to or are otherwise associated with large angular frequencies and high frequency content in the intensity signals $I_I(t)$ and $I_Q(t)$.

The output intensity signals of the modulators 210 and 212 may be communicated to one or more photodetectors. For example, the output of modulator 210 may be communicated to photodetector 224, and the output of modulator 212 may be communicated to photodetector 226. The photodetector 224 may measure the intensity of signal $I_I(t)$ and provide an analog signal to an analog-to-digital converter (ADC) 228. The photodetector 226 may measure the intensity of signal $I_Q(t)$ and provide an analog signal to ADC 230.

Figure 5:
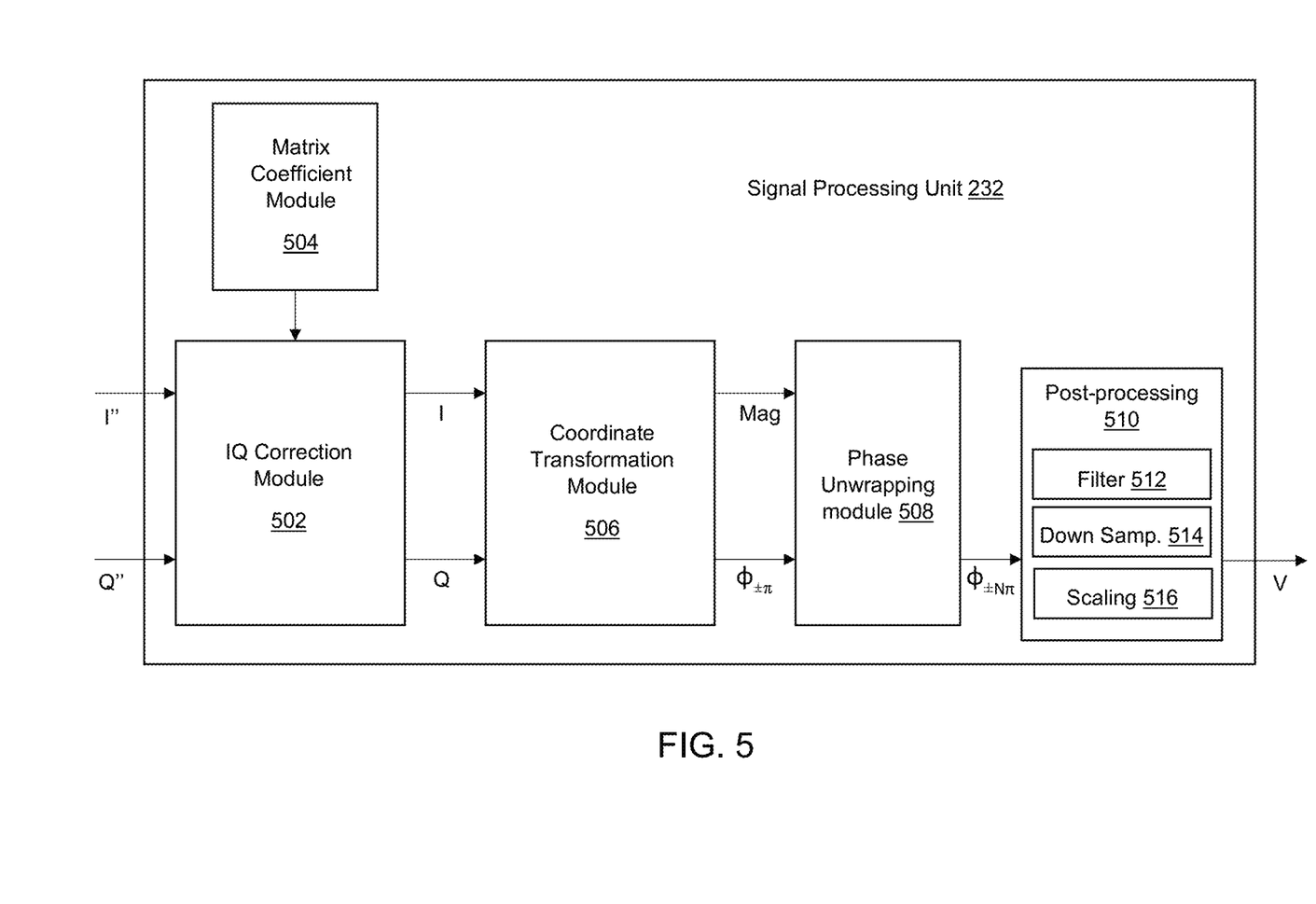
FIG. 5 illustrates the signal processing unit of FIG. 2 in accordance with one embodiment.

FIG. 5 illustrates the signal processing unit 232 of FIG. 2 in accordance with one embodiment. The signal processing unit 232 may include one or more processors executing instructions stored on memory to perform any required analysis or procedures on inputs from the ADC 228 and ADC 230. The processor(s) may include a microprocessor, a field programmable gate array (FPGA), an application-specific integrated circuit (ASIC), or other similar devices. In some embodiments, such as those relying on one or more ASICs, the functionality described as being provided in part via software may instead be configured into the design of the ASICs and, as such, the associated software may be omitted.

The memory may be L1, L2, L3 cache, or RAM memory configurations. The memory may include non-volatile memory such as flash memory, EPROM, EEPROM, ROM, and PROM, or volatile memory such as static or dynamic RAM, as discussed above. The exact configuration/type of memory may vary as long as instructions for processing the received signals can be executed.

The signal processing unit 232 may include an IQ correction module 502, a matrix coefficient module 504, a coordinate transformation module 506, a phase unwrapping module 508, and a post-processing module 510. The post-processing module 510 may further include a filtering submodule 512, a down-sampling submodule 514, and a scaling submodule 516.

The IQ correction module 502 module may receive as input signal I″ from the ADC 228 and the signal Q″ from the ADC 230. The signal processing unit 232 may perform any number of procedures to correct or otherwise adjust IQ magnitude and phase imbalances. These imbalances may be due to differences in the modulators 210 and 212, the biases of the modulators 210 and 212, differences in the photodetectors 224 and 226, or the like. For example, the IQ correction module 502 may apply an ABCD correction matrix of the form:

$$\begin{bmatrix} I \\ Q \end{bmatrix} = \begin{bmatrix} A & B \\ C & D \end{bmatrix} \begin{bmatrix} J'' \\ Q'' \end{bmatrix}$$

Where the matrix coefficient module 504 provides the coefficients A, B, C, and D.

The calculated I and Q values may be communicated to the coordinate transformation module 506. The coordinate transformation module 506 may perform any appropriate transformations on the received inputs I and Q. For example, the coordinate transformation module 506 may execute an Arc Tangent algorithm, a CORDIC algorithm, or the like.

The phase unwrapping module 508 may execute a phase unwrapping procedure to construct the signal's original phase. The act of phase unwrapping increases the number of bits, as high frequency content is converted to amplitude content. A result may be oversampled data, however.

The filtering submodule 512 may the filter the oversampled data to increase the signal-to-noise ratio and the effective number of bits of the received signal. Oversampling and averaging can increase the effective number of bits (ENOB).

The down-sampling submodule 514 may reduce the size of the received signal by lowering the number of bits per sample. For example, the down sampling module may reduce the sampling rate from GSPS to MSPS. The scaling submodule 516 may remove the effect of gain due to the value of $V_\pi$ and that of other parameters to produce an output of the correct magnitude. The output of the signal processing unit 232 is then a processed signal V.

Figure 6:
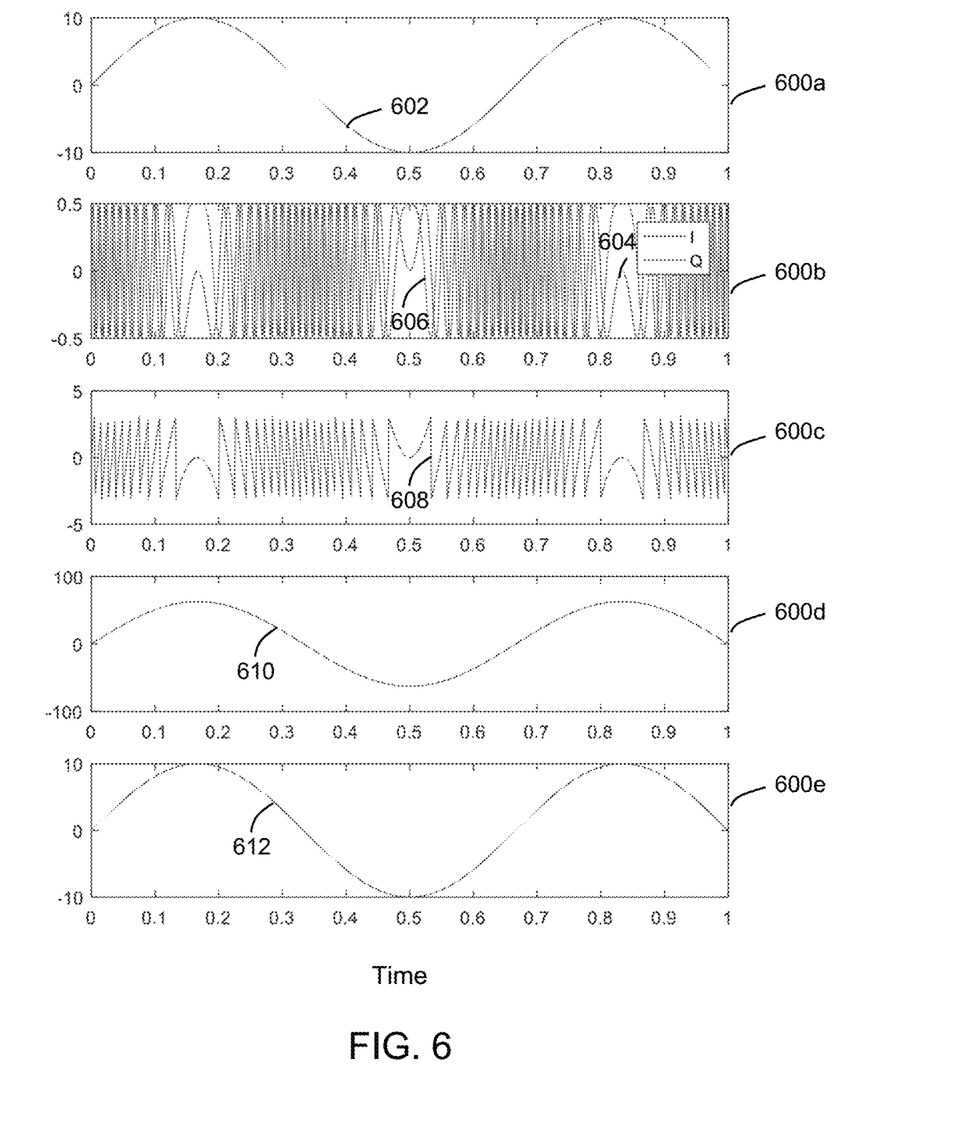
FIG. 6 illustrates several graphs of signals produced by various processing steps in accordance with one embodiment.

FIG. 6 illustrates several graphs 600a-e of signals produced by the various steps described above. For example, signal 602 of graph 600a may refer to the signal received by the antenna 202 of FIG. 2. The signals 604 and 606 of graph 600b may refer to signal I and signal Q, respectively, produced by the IQ correction module 502 of FIG. 5. Signal 608 of 600c may refer to the signal produced by the coordinate transformation module 506 (e.g., after the signal is converted to polar coordinates). Signal 610 of graph 600d may refer to the signal produced by the phase unwrapping module 508. This signal 610 may include highly oversampled data. Signal 612 of graph 600e may refer to the signal produced by the post-processing module 510 (e.g., after decimating, filtering, scaling, etc.).

Figure 7:
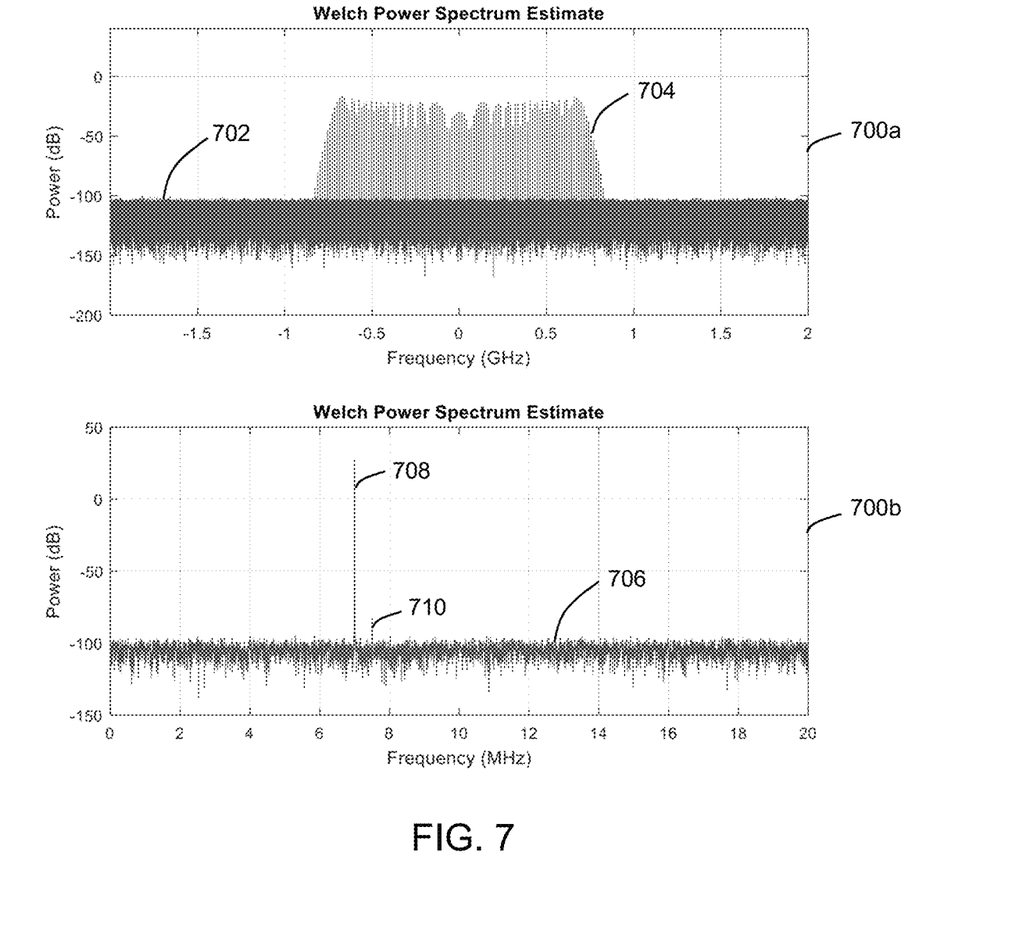
FIG. 7 depicts power spectrum plots of a signal before and after processing in accordance with one embodiment.

FIG. 7 depicts plots 700a and 700b of a power spectrum of signal 702, 706 in accordance with one embodiment. Plot 700a depicts the power spectrum estimate of a signal 702 that is provided to an ADC such as the ADC 228 of FIG. 2. As seen in plot 700a, the signal 702 is accompanied by broadband signal 704. This broadband signal 704 may contain information about signals of interest, unwanted interfering signals, and noise. Signal 702 is one example of the power spectrum of I and Q intensity modulated signals such as the signals 604 and 606 FIG. 6 or the coordinate transformation result 608, and would be challenging and expensive to record and interpret using traditional receivers and signal processing methods due to the wide bandwidth and dense power spectrum.

Plot 700b depicts the power spectrum of the resultant signal 706 produced by the post-processing module 510 of FIG. 5. As seen in 700b, the broadband signal 704 has been decomposed into a set of narrowband signals which could be recorded, analyzed, and interpreted with fewer resources than required to process the signal 704 itself. Plot 700b also illustrates the presence of an interferer 708 in the presence of signal of interest 710, and resultant signal 706 might contain additional weak signals of interest, environmental noise, or other features that could be individually recorded, analyzed, and interpreted. In some embodiments, resultant signal 706 or individual features such as signals 708 or 710 may be straightforward to record or interpret using limited hardware or human resources, while a signal such as 602 of FIG. 6 from an antenna or intensity modulated signal 702 would be impossible to directly record or interpret using commercially available hardware or with resource limitations.

In some embodiments, the RF signals are sent to one or more modulators over a distribution network that may be different from a signal splitter, at which point they modulate one or more optical signals and therefore transmit the RF signals over optical fiber. This preserves and transmits the RF signals the same way as traditional RF waveguides. Accordingly, the optical components can replace RF components in the RF signal path while preserving all essential RF signal parameters.

Figure 8:
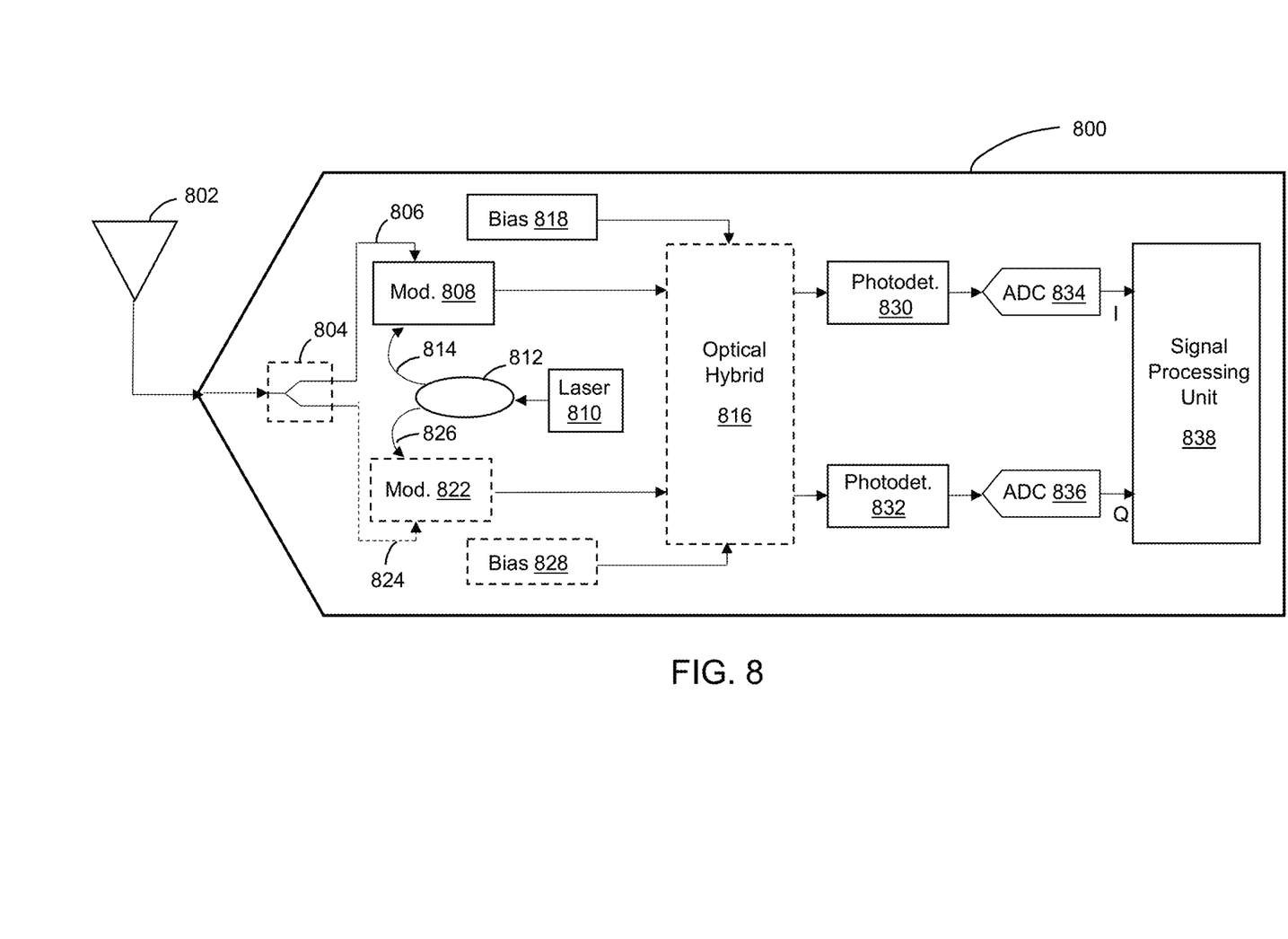
FIG. 8 illustrates a digitizer in accordance with another embodiment.

FIG. 8 illustrates an apparatus (e.g., a digitizer) 800 for processing a signal in accordance with another embodiment. In operation, an antenna 802 may receive an RF signal from a source (not shown in FIG. 8). As discussed above, the signal may be accompanied by radio noise from any number of sources or causes. The digitizer 800 may include one or more phase modulators, and the received RF signals may be transferred to fiber before splitting.

Accordingly, in this embodiment, the digitizer 800 may or may not include a signal splitter 804. In embodiments without a signal splitter 804, the received signal may be transmitted from the antenna 802 to a phase modulator 808. The digitizer 800 may also include a laser source 810 emitting an optical signal to optionally be split by an optical splitter 812. The optical splitter 812 may enable incident light from the laser source 810 to be split into multiple light beams, and light beam 814 may be transmitted to the phase modulator 808. Accordingly, the phase modulator 808 may receive as input the RF signal 806 and a light beam 814.

The output of the modulator 808 may be communicated to an optical hybrid 816, which may include some combination of transformers, power dividers, wavelength filters, resonators, frequency multiplexers, couplers, or the like. The optical hybrid 816 can serve as an optical waveguide and splitter network. It may receive one or more optical signals, split the signals, and combine them such that one or more optical outputs include the interference of signals with more than one bias setting. The optical hybrid 816 may be fully passive, or may have actively-controlled components.

They optical hybrid 816 may also include or otherwise provide a bias parameter 818. For example, the bias parameter 818 may be partly or completely fixed during fabrication and assembly of the physical components of the digitizer 800 as opposed to a separate analog or digital signal. This may be done by adjusting features of the modulator(s) or the signal paths for radio frequency (RF), optical signals, or both. Accordingly, this may remove the need for a variable analog or digital bias signal. These configurations may provide benefits such as reduced power consumption, simplified system control, reduced noise, and reduced sensitivity to unwanted external signals. Accordingly, the functionality provided by the components of the digitizer 800 may provide the required intensity modulation without requiring two distinct intensity modulator components (e.g., as in FIG. 2). Instead, the optical hybrid 816 can perform any required RF signal splitting, intensity modulation, and bias establishment.

FIG. 8 also illustrates an optional modulator 822 (e.g., a phase modulator). The optional modulator 822 may receive a second RF signal 824, such as if a signal was split by an RF splitter 804 as in FIG. 2, and a light beam 826 from the optical splitter 812.

The output of the modulator 822 may be communicated to the hybrid mixer module 816. The hybrid mixer module 816 may also include or otherwise provide a bias parameter 828 as discussed previously.

The optical hybrid 816 may output intensity-modulated outputs to photodetectors 830 and 832, which may operate similarly to photodetectors 224 and 226 of FIG. 2. The digitizer 800 may further include ADCs 834 and 836, which may operate similarly to the ADCs 228 and 230 in FIG. 2.

The digitizer 800 may also include a signal processing unit 838, which may operate similarly to the signal processing unit 232 of FIG. 2.

Figure 9:
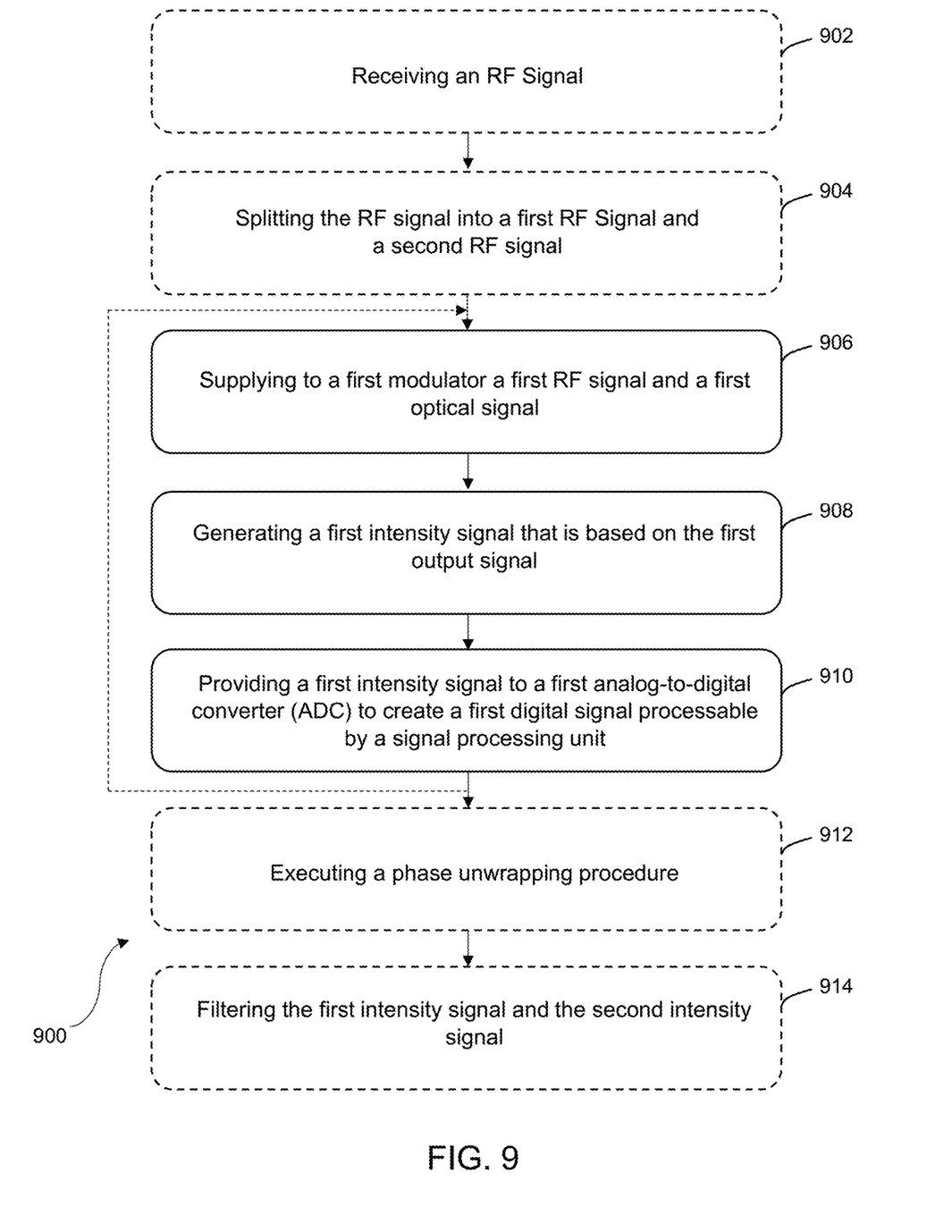
FIG. 9 depicts a flowchart of a method for processing a signal in accordance with one embodiment.

FIG. 9 depicts a flowchart of a method 900 for processing a signal in accordance with one embodiment. The digitizer 200 of FIG. 2 or digitizer 800 of FIG. 8 or components thereof may perform one or more of the steps of method 900.

Step 902 involves receiving an RF signal. An antenna such as the antenna 202 or 808 of FIG. 2 or FIG. 8, respectively, may receive the RF signal and may forward the signal to the digitizer 200 or 800. The signal may include or otherwise be degraded by noise to lightning, atmospheric gasses, the sun, the Earth's surface, man-made sources, and temperature.

Step 904 involves splitting the RF signal into a first RF signal and a second RF signal. Step 904 may involve the signal splitter 204 of FIG. 2, which may be a resistive power splitter, a hybrid power splitter, or the like. Step 904 is optional in that as in FIG. 8, the signal splitter 804 may be optional, particularly if there is only one modulator.

Step 906 involves supplying to a first modulator a first RF signal, and a first optical signal. The first modulator may be a Mach-Zehnder modulator, for example, and may also receive a first biasing parameter.

Step 908 involves generating a first intensity signal that is based on the first output signal, wherein the first intensity signal is further based on a first biasing parameter. As discussed in conjunction with FIG. 2, the first modulator may be configured to output a first intensity signal resultant from the first RF signal, the first optical signal, and the first biasing signal. Alternatively, the first modulator may output an output signal that is later combined with a first biasing parameter, such as in FIG. 8.

Step 910 involves providing a first intensity signal to a first analog-to-digital converter (ADC) to create a first digital signal processable by a signal processing unit. This step may further involve providing the first intensity signal to a photodetector to produce an analog signal representative of an intensity of the first intensity signal. The produced analog signal may be communicated to the first ADC Steps 906-910 may be iterated for additional signals and modulators (e.g., a second modulator). For example, some embodiments may involve a second modulator that receives a second RF signal and a second optical signal. As discussed in conjunction with FIG. 2, the second modulator may be configured to output a second intensity signal resultant from a second RF signal, a second optical signal, and a second biasing signal.

In embodiments with more than one modulator, the first and second modulators may be biased 90 degrees apart and may be integrated on a substrate of the digitizer. As the first and second modulators are biased 90 degrees apart, the first and second intensity signals may be at least approximately in phase quadrature.

Step 912 involves executing a phase unwrapping procedure to reconstruct the phase of the received RF signal. Phase unwrapping increases the number of bits, as high frequency content is converted to amplitude content.

Step 914 involves filtering, using the signal processing unit, at least the first intensity signal to increase the signal-to-noise ratio and effective number of bits. The embodiments described herein therefore provide a hardened HF power capability. The embodiments herein may process signals of up to +40 dBM while receiving noise-limited, signals of interest.

For example, the digitizer of the described embodiments can handle 50 Msamples/sec with a performance of 20

ENOB. The digitizer of the described embodiments may also achieve 25.3 ENOB in processing a 152 dB signal in a bandwidth of 15 kHz.

As seen in the previous figures, the embodiments herein also do not require analog mitigation strategies. For example, the embodiments described herein do not require AGCs, limiters, or cancellers. The embodiments herein also do not require low-noise amplifiers, which may significantly distort a received signal.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Embodiments of the present disclosure, for example, are described above with reference to block diagrams and/or operational illustrations of methods, systems, and computer program products according to embodiments of the present disclosure. The functions/acts noted in the blocks may occur out of the order as shown in any flowchart. For example, two blocks shown in succession may in fact be executed substantially concurrent or the blocks may sometimes be executed in the reverse order, depending upon the functionality/acts involved. Additionally, or alternatively, not all of the blocks shown in any flowchart need to be performed and/or executed. For example, if a given flowchart has five blocks containing functions/acts, it may be the case that only three of the five blocks are performed and/or executed. In this example, any of the three of the five blocks may be performed and/or executed.

A statement that a value exceeds (or is more than) a first threshold value is equivalent to a statement that the value meets or exceeds a second threshold value that is slightly greater than the first threshold value, e.g., the second threshold value being one value higher than the first threshold value in the resolution of a relevant system. A statement that a value is less than (or is within) a first threshold value is equivalent to a statement that the value is less than or equal to a second threshold value that is slightly lower than the first threshold value, e.g., the second threshold value being one value lower than the first threshold value in the resolution of the relevant system.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Having described several example configurations, various modifications, alternative constructions, and equivalents may be used without departing from the spirit of the disclosure. For example, the above elements may be components of a larger system, wherein other rules may take precedence over or otherwise modify the application of various implementations or techniques of the present disclosure. Also, a number of steps may be undertaken before, during, or after the above elements are considered.

Having been provided with the description and illustration of the present application, one skilled in the art may envision variations, modifications, and alternate embodiments falling within the general inventive concept discussed in this application that do not depart from the scope of the following claims.

What is claimed is:

1. A method for processing a signal, the receiving comprising:
   supplying to a first modulator:
     a first RF signal, and
     a first optical signal, wherein the first modulator is configured to output a first output signal;
   generating a first intensity signal that is based on the first output signal, wherein the first intensity signal is further based on a first biasing parameter; and
   providing a first intensity signal to a first analog-to-digital converter (ADC) to create a first digital signal processable by a signal processing unit.

2. The method of claim 1 wherein providing the first intensity signal to the first ADC includes providing the first intensity signal to a photodetector to produce an analog signal representative of an intensity of the first intensity signal, wherein the produced analog signal is communicated to the first ADC.

3. The method of claim 1 further comprising:
   splitting an RF signal into the first RF signal and a second RF signal;
   supplying to a second modulator:
     the second RF signal, and
     a second optical signal, wherein the second modulator is configured to output a second output signal;
   generating a second intensity signal that is based on the second output signal, wherein the second intensity signal is further based on a second biasing parameter; and
   providing the second intensity signal to a second analog-to-digital converter (ADC) to create a second digital signal processable by the signal processing unit.

4. The method of claim 1 wherein the first intensity signal and the second intensity signal are at least approximately in phase quadrature.

5. The method of claim 1 further comprising providing the first output signal from the first modulator to an optical hybrid, wherein the optical hybrid is configured to provide the first biasing parameter to the first output signal to generate the first intensity signal.

6. The method of claim 5 wherein the first biasing parameter is partly or fully fixed during fabrication of the optical hybrid.

7. The method of claim 1 wherein the first intensity signal and the second intensity signal are each transmitted as an optical signal.

8. The method of claim 1 further comprising filtering, using the signal processing unit, the first intensity signal and the second intensity signal to increase the signal-to-noise ratio and effective number of bits.

9. The method of claim 1 further comprising executing a phase unwrapping procedure to reconstruct the phase of the received RF signal.

10. A signal processing apparatus comprising:
    a first modulator configured to receive:

a first RF signal,
a first optical signal, and
further configured to output a first output signal that is further used to generate a first intensity signal, wherein the first intensity signal is further based on a first biasing parameter; and
at least one analog-to-digital converter (ADC) to create from the first intensity signal a first digital signal processable by a signal processing unit.

11. The apparatus of claim 10 further comprising a first photodetector configured to measure the first intensity signal and produce an analog signal representative of an intensity of the first intensity signal and communicate the analog signal to the signal processing unit.

12. The apparatus of claim 10 further comprising:
an RF splitter to split an RF signal into the first RF signal and the second RF signal; and
a second modulator configured to receive:
a second RF signal,
a second optical signal, and
further configured to output a second output signal that is further used to generate a second intensity signal, wherein the second intensity signal is further based on a second biasing parameter.

13. The apparatus of claim 10 wherein the first intensity signal and the second intensity signal are at least approximately in phase quadrature.

14. The apparatus of claim 10 further comprising an optical hybrid configured to provide the first biasing parameter to the first output signal to generate the first intensity signal.

15. The apparatus of claim 14 wherein the first biasing parameter is partly or fully fixed during fabrication of the optical hybrid.

16. The apparatus of claim 10 wherein the signal processing unit is further configured to filter the first intensity signal to increase the signal-to-noise ratio and effective number of bits.

17. The apparatus of claim 10 wherein the signal processing unit is further configured to execute a phase unwrapping procedure to reconstruct the phase of the RF signal.

18. The apparatus of claim 10 wherein the first modulator is further configured to receive the first biasing parameter.

19. A method for processing a signal, the method comprising:
supplying to a first modulator:
a first RF signal, and
a first optical signal, wherein the first modulator is configured to output a first output signal;
generating a first intensity signal that is based on the first output signal, wherein the first intensity signal is further based on a first biasing parameter;
providing the first intensity signal to a photodetector to produce an analog signal representative of an intensity of the first intensity signal;
providing the analog signal to a first analog-to-digital converter (ADC) to create a first digital signal processable by a signal processing unit; and
executing a phase unwrapping procedure to reconstruct the phase of the first RF signal.

* * * * *